United States Patent
Muddu

(10) Patent No.: US 6,550,048 B1
(45) Date of Patent: Apr. 15, 2003

(54) METHOD AND SYSTEM FOR DETERMINING REPEATER ALLOCATION REGIONS

(75) Inventor: Sudhakar Muddu, Milpitas, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 165 days.

(21) Appl. No.: 09/714,047

(22) Filed: Nov. 15, 2000

(51) Int. Cl.$^7$ .................................................. G06F 9/45
(52) U.S. Cl. ................... 716/10; 716/8; 716/9; 716/11
(58) Field of Search .............................. 716/2, 6–8, 10, 716/12, 13

(56) References Cited

U.S. PATENT DOCUMENTS

| | | | | |
|---|---|---|---|---|
| 5,557,779 A | * | 9/1996 | Minami | 716/6 |
| 6,412,101 B1 | * | 6/2002 | Chang et al. | 716/10 |

* cited by examiner

Primary Examiner—Vuthe Siek
Assistant Examiner—Naum Levin
(74) Attorney, Agent, or Firm—Baker Botts L.L.P.

(57) ABSTRACT

A system and method for determining a repeater allocation region is disclosed. A path delay equation describing a path delay from a driver to a gate is formulated. A delay constraint is applied to the path delay equation. A repeater allocation region indicating a position of a repeater is determined from the path delay equation.

22 Claims, 3 Drawing Sheets

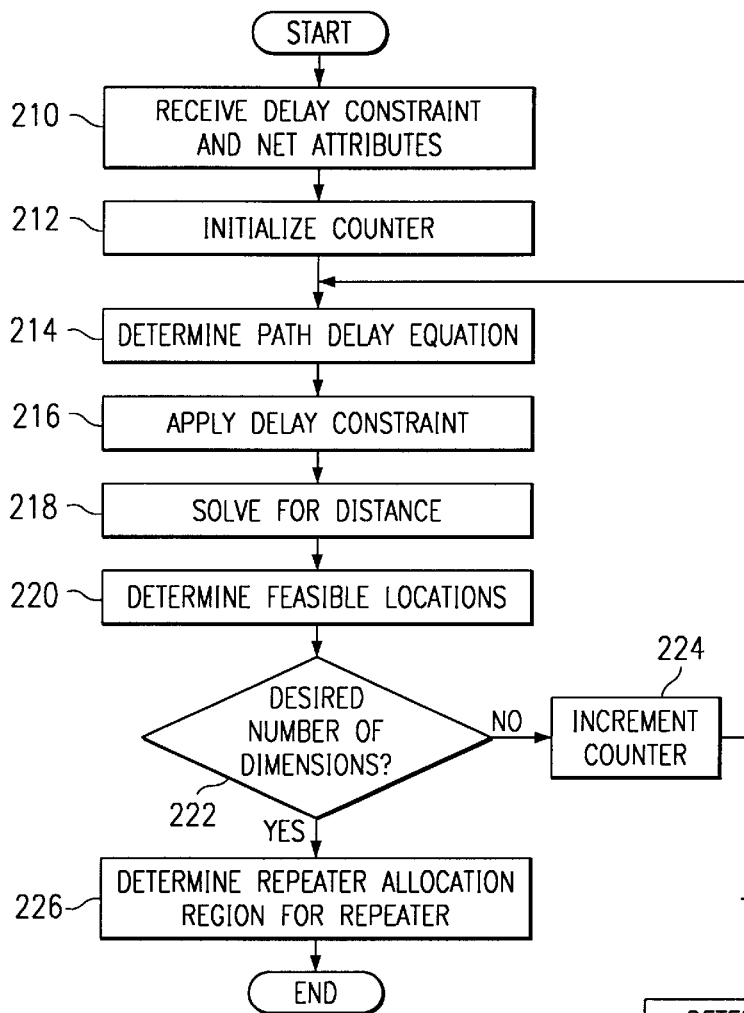
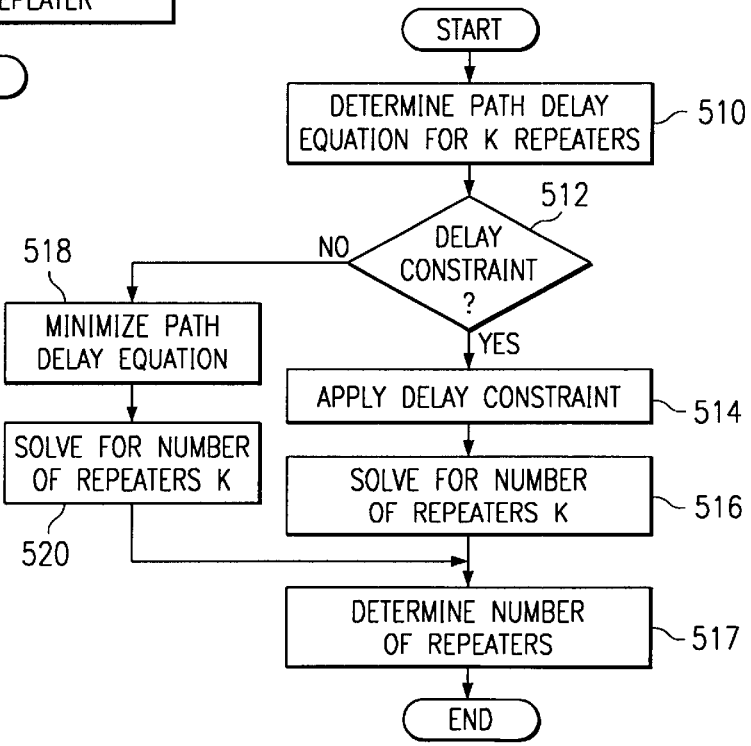

METHOD AND SYSTEM FOR DETERMINING REPEATER ALLOCATION REGIONS

TECHNICAL FIELD OF THE INVENTION

This invention relates generally to the field of system design and more specifically to a method and system for determining repeater allocation regions.

BACKGROUND OF THE INVENTION

Determining repeater placement is critical in designing circuits. Inserting repeaters in a path of an interconnect improves a signal traveling on the path. There are, however, regions of the circuit where a repeater cannot be located, for example, a region designated for another element. Moreover, certain arrangements of repeaters fail to satisfy constraints applied to the circuit or fail to optimize performance of the circuit. Accordingly, determining repeater placement has posed challenges for circuit designers.

SUMMARY OF THE INVENTION

In accordance with the present invention, a method and system for determining repeater allocation regions are provided that substantially eliminate or reduce the disadvantages and problems associated with previously developed systems and methods.

According to one embodiment of the present invention, a method for determining a repeater allocation region is disclosed. A path delay equation describing a path delay from a driver to a gate is formulated. A delay constraint is applied to the path delay equation. A repeater allocation region indicating a position of a repeater is determined from the path delay equation.

According to another embodiment of the present invention, a system for determining a repeater allocation region is disclosed. A path delay module formulates a path delay equation describing a path delay from a driver to a gate. A processor applies a delay constraint to the path delay equation, and determines a repeater allocation region from the path delay equation. The repeater allocation region indicates a position of a repeater.

According to yet another embodiment of the present invention, logic for determining a repeater allocation region is disclosed. The logic formulates a path delay equation describing a path delay from a driver to a gate. The logic also applies a delay constraint to the path delay equation, and determines a repeater allocation region from the path delay equation. The repeater allocation region indicates a position of a repeater.

Embodiments of the invention may provide numerous technical advantages. A technical advantage of one embodiment is that repeater allocation regions are determined that allow circuit designers to optimally place repeaters on a circuit. Repeater allocation regions represent regions where a repeater may be placed while satisfying a delay constraint, and may be determined in one, two, or three spatial dimensions. Circuit designers may use the repeater allocation regions to determine an arrangement of repeaters without wasting circuit area.

Another technical advantage of one embodiment is that an optimal number of repeaters may be determined. Given a delay constraint, an optimal number of repeaters that satisfies the delay constraint may be calculated. Alternatively, an optimal number of repeaters may be calculated for a net, without given a delay constraint. Accordingly, embodiments provide for determination of an optimal number and placement of repeaters on a circuit.

Another technical advantage of one embodiment is that the embodiment may be used to determine repeater allocation regions for system design, interconnect design, circuit design, board design, and backplane design, among other areas of computer design.

Other technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which:

FIG. 4 is a flowchart of a method for determining a repeater allocation region for a repeater that may be used with the system of FIG. 3;

FIG. 6 is a flowchart of a method for determining the number of repeaters to place between a driver and a gate.

DETAILED DESCRIPTION OF THE DRAWINGS

Embodiments of the present invention and its advantages are best understood by referring to FIGS. 1 through 6 of the drawings, like numerals being used for like and corresponding parts of the various drawings.

Figure 1:
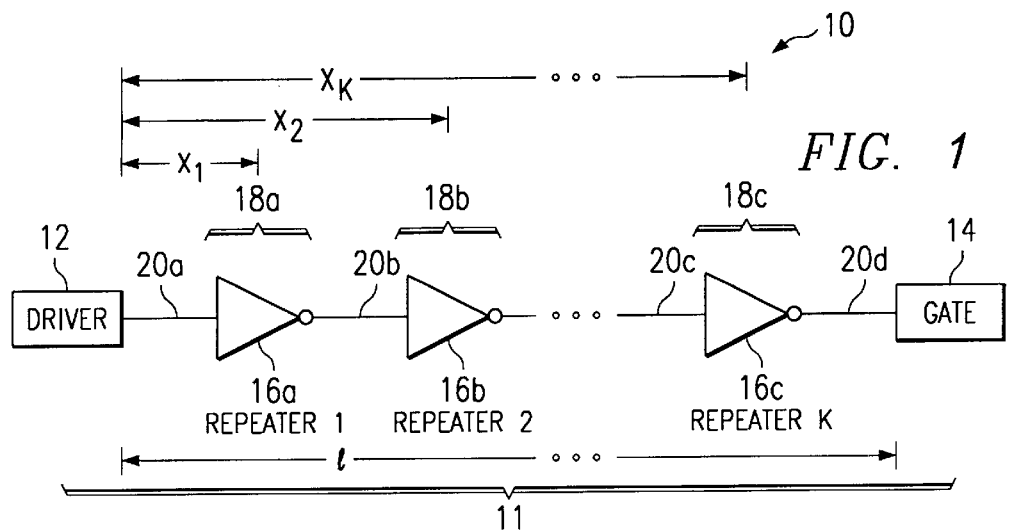
FIG. 1 illustrates a net for which repeater allocation regions may be determined.

FIG. 1 illustrates a net 10 of a circuit board layout for which repeater allocation regions 18 may be determined. Net 10 includes an interconnect 11 with a source such as a driver 12 and a destination such as a gate 14, where m represents the length of interconnect 11 from driver 12 to gate 14. Repeaters 16 coupled by segments 20 are inserted between driver 12 and gate 14 in order attenuate a signal through interconnect 11. Repeaters 16 may include, for example, inverting repeaters. Repeater allocation region 18 describes a region or location where repeater 16 may be inserted such that the path delay from driver 12 to gate 14 meets a delay constraint $T_{budget}$ for net 10. Delay constraint $T_{budget}$ describes the maximum amount of time allotted for a signal to travel from driver 12 to gate 14 along interconnect 11. Although repeater allocation region 18 is illustrated as one-dimensional, repeater allocation regions may be two- or three-dimensional.

Distance x represents the distance from driver 12 in the direction of gate 14. Distance $x_i$ is the distance of repeater i from driver 12. Accordingly, there are (i−1) repeaters 16 and i segments 20 in length $x_i$ of interconnect 11. K represents the total number of repeaters from driver 12 to gate 14. Net 10 is described by net attributes. For example, gate 14 has a gate load $C_G$, and driver 12 has an output resistance $R_{drv}$. Repeater 16 has a driver resistance $R_{rep}$ and an input gate capacitance $C_{rep}$. The interconnect resistance and capacitance per unit length of interconnect 11 is represented by r and c, respectively. $C_x^{eff}$ represents the effective capacitance of the interconnect capacitance due to resistance shielding, $C_{rep}^{eff}$ represents the effective capacitance of the repeater gate capacitance as seen at the driver output. Typically, the effective capacitance at the gate output can be approximated as $C_x^{eff}=\alpha xc$ and $C_{rep}^{eff}=\alpha C_{rep}$, where alpha is a constant between 1/6 and 5/6. Any suitable method, however, may be used to determine $C_x^{eff}$.

Figure 2:
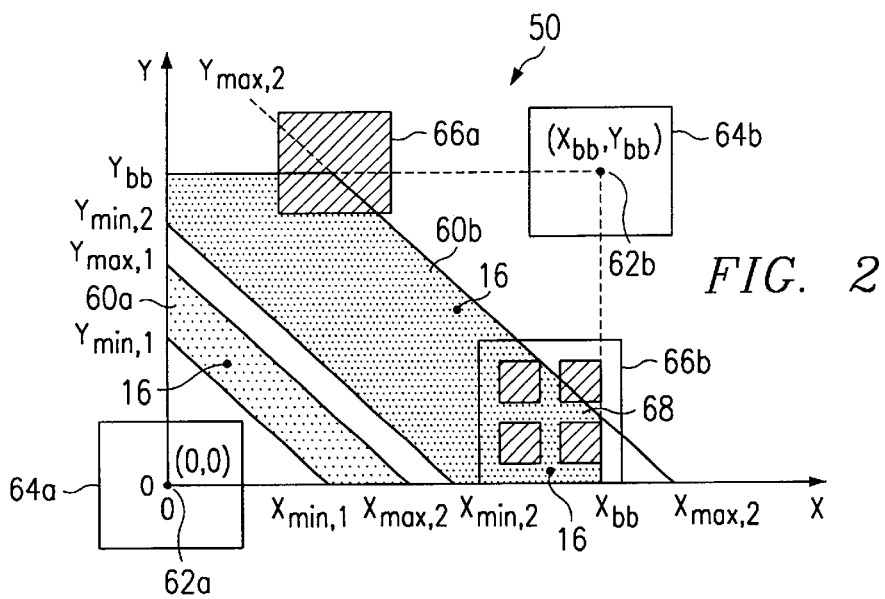
FIG. 2 is a graph illustrating repeater allocation regions for a two-pin net.

FIG. 2 is a graph 50 illustrating repeater allocation regions 60 for repeaters 16 of a circuit board layout. Although graph 50 illustrates repeater allocation regions 60 in two-dimensions, any number of dimensions may be used. Pins 62a and 62b, or interconnect endpoints, are located at (0,0) and $(X_{bb}, Y_{bb})$, respectively, where $X_{bb}$ and $Y_{bb}$ define the bounding block between pins 62a and 62b. Design blocks 64 for pins 62 represent regions where repeaters 16 may not be placed.

Repeater allocation regions 60a and 60b represent regions where repeaters. 16a and 16b, respectively, may be placed that optimize the performance of net 10 and satisfy delay constraint $T_{budget}$. Repeater allocation regions 60 are determined by calculating maximum and minimum coordinates for a repeater 16. For example, $X_{min}{}^1$ and $X_{max}{}^1$ are the minimum and maximum distances in the x-direction for repeater 16a, and $Y_{min}{}^1$ and $Y_{max}{}^1$ are the minimum and maximum distances in the y-direction for repeater 16a. Although repeater allocation regions 60 for two repeaters 16 are illustrated, repeater allocation regions for any number of repeaters 16 may be determined.

Each design block 66 represents a region where a repeater 16 may not be placed. "Each" refers to each member of a set or each member of a subset of the set. Design block 66b, however, includes a reserved region 68 where repeaters may be placed. Accordingly, repeaters 16 may be placed in parts of repeater allocation region 60b that do not overlap with a non-reserved region of a design block 66.

Although two pins 62 are illustrated, any number of pins may be used. A multi-pin net may be decomposed into multiple two-pin nets, for which repeater allocation regions 60 can be individually determined. Repeater allocation regions 60 for the two-pin nets are then assembled into the multi-pin net, where some repeaters 16 may be combined to reduce the total number of repeaters.

Figure 3:
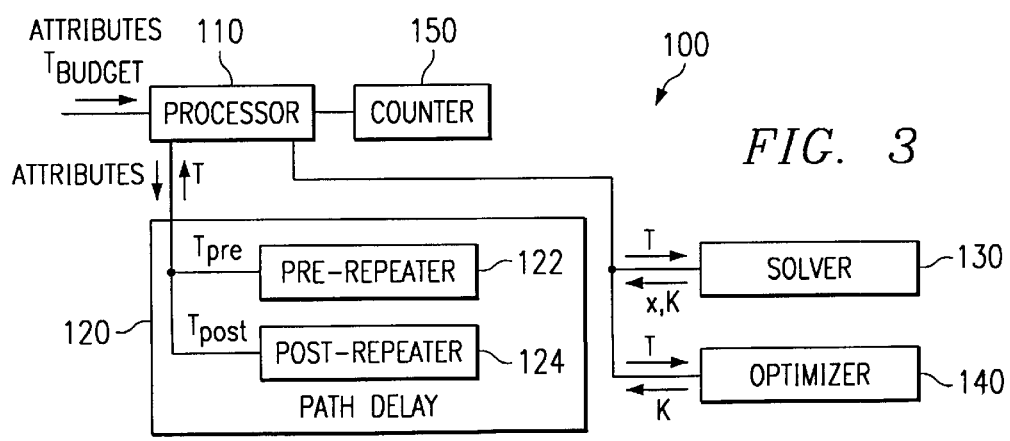
FIG. 3 illustrates a system for determining repeater allocation regions for the net of FIG. 1.

FIG. 3 illustrates a system 100 for determining repeater allocation regions for net 10 of FIG. 1. The operations of system 100 may be performed using hardware, software or any combination of the preceding, and may be performed using any number, combination, or arrangement of processors or modules. System 100 includes a processor 110 that controls the process of determining repeater allocation regions for net 10. Given the net attributes and a delay constraint $T_{budget}$, processor 110 determines coordinates of repeater allocation regions for net 10. The repeater allocation regions may be described in terms of one dimension x, two dimensions x and y, or three dimensions x, y, and z. A counter 150 counts the number of dimensions and the number of repeaters 16 that have been processed.

A path delay module 120 determines an equation for the path delay from driver 12 to gate 14, given the net attributes. A pre-repeater module 122 determines a path delay equation $T_{pre}$ from driver 12 to a repeater 16, and a post-repeater module 124 determines a path delay equation $T_{post}$ from the repeater 16 to gate 14. The path delay $T_{path}$ is the sum of the pre-repeater path delay $T_{pre}$ and the post-repeater path delay $T_{post}$. A solver module 130 solves a path delay equation T for distance x or a number of repeaters K. An optimizer 140 optimizes an input path delay equation for a number of repeaters K in order to determine an optimal number of repeaters K.

Figure 5:
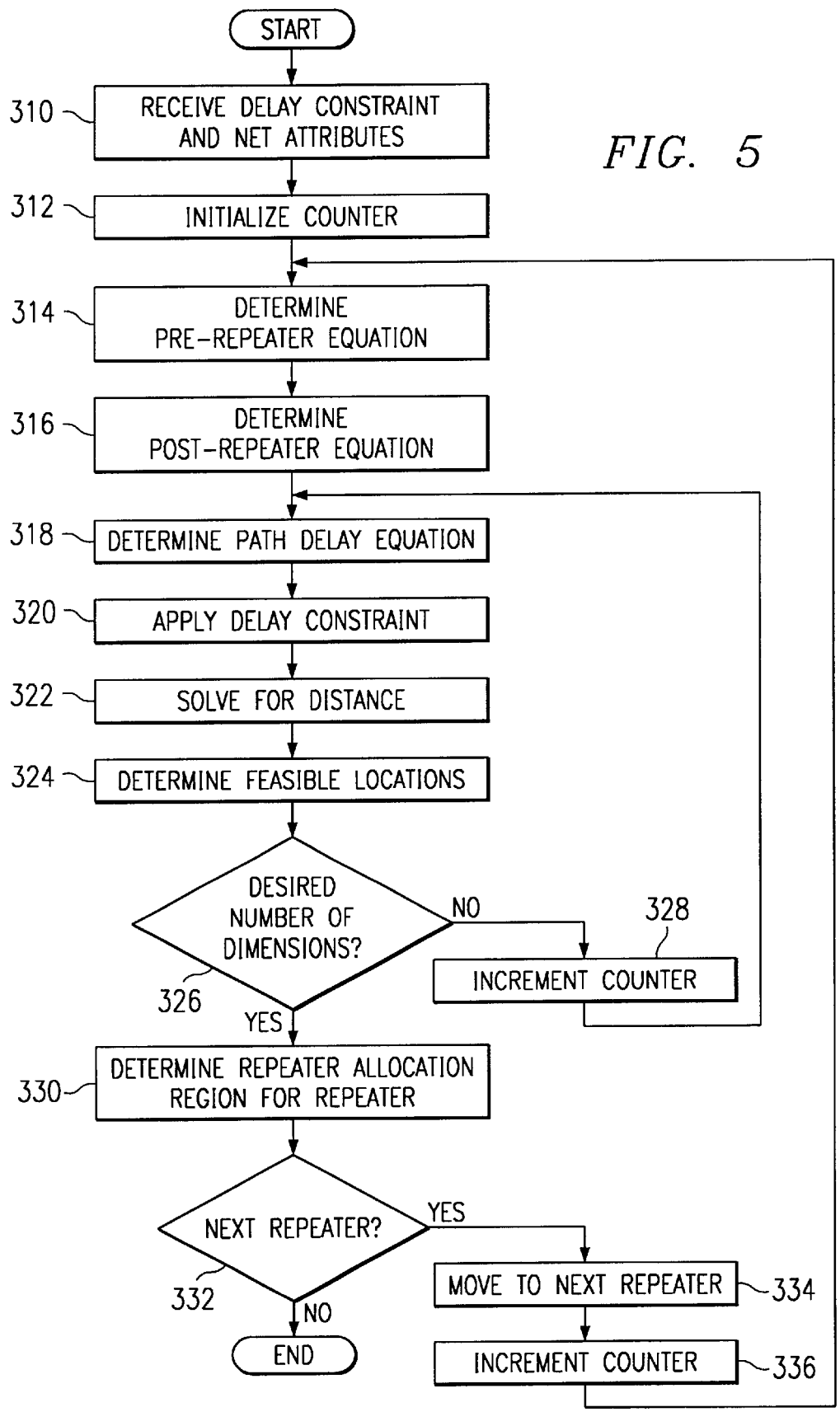
FIG. 5 is a flowchart of a method for determining repeater allocation regions for multiple repeaters that may be used with the system of FIG. 3.

System 100 determines repeater allocation regions for one or more repeaters 16 that optimizes the performance of net 10 and satisfies a delay constraint $T_{budget}$. Additionally, system 100 determines an optimal number of repeaters 16 either with or without delay constraint $t_{budget}$. Accordingly, system 100 allows circuit designers to determine an optimal arrangement of repeaters 16 prior to interconnect optimization. FIGS. 4 through 6 describe methods that may be performed with system 100.

FIG. 4 is a flowchart of a method for determining a repeater allocation region 60 for a repeater 16 that may be used with system 100 of FIG. 3. The method begins at step 210, where processor 110 receives delay constraint $t_{budget}$ and net attributes describing net 10. The net attributes include, for example, length m of interconnect 11 from driver 12 to gate 14, gate load $C_G$, repeater driver resistance $R_{rep}$ and input gate capacitance $C_{rep}$, driver output resistance $R_{drv}$, and number of repeaters K.

Counter 150 is initialized at step 212 to track the number of dimensions that have been processed. Path delay module 120 determines a path delay equation from the received net attributes at step 214. Path delay $T_{path}$ as a function of distance variable x may be calculated using Equation (1):

$$T_{path} = R_{drv}(C_x^{eff} + C_{rep}^{eff}) + \frac{rcx^2}{2} + rxC_{rep} + \\ R_{rep}(C_{(m-x)}^{eff} + C_G^{eff}) + \frac{rc(m-x)^2}{2} + r(m-x)C_G \quad (1)$$

Processor 110 receives path delay $T_{path}$ from path delay module 120, and applies delay constraint $T_{budget}$ to path delay $T_{path}$ at step 216, as expressed by Equation (2):

$$T_{budget} = R_{drv}(\alpha xc + \alpha C_{rep}) + \frac{rcx^2}{2} + rxC_{rep} + \\ R_{rep}(\alpha(m-x)c + \alpha C_G) + \frac{rc(m-x)^2}{2} + r(m-x)C_G \quad (2)$$

At step 218, solver module 130 solves path delay $T_{path}$ for distance variable x, as described by Equation (3):

$$x^2 rc + x(\alpha R_{drv}c + rC_{rep} - \alpha cR_{rep} - rcm - rC_G) + \\ \left(\alpha R_{drv}C_{rep} + \alpha R_{rep}cm + \alpha R_{rep}C_G + \frac{rcm^2}{2} + rmC_G - T_{budget}\right) = 0 \quad (3)$$

Equation (3) may be expressed by Equation (4):

$$x^2 a_2 + x a_1 + a_0 = 0 \quad (4)$$

where terms $a_0$, $a_1$, and $a_2$ represent the coefficients of $x_0$, $x_1$, and $x_2$, respectively. Solving Equation (4) for the distance variable x yields $x_{min}$ and $x_{max}$, as expressed by Equation (5):

$$x_{min} = \text{MAX}\left(0, \frac{-a_1 - \sqrt{a_1^2 - 4a_2 a_0}}{2a_1}\right) \quad (5)$$

-continued $$x_{max} = MIN\left(1, \frac{-a_1 + \sqrt{a_1^2 - 4a_2a_0}}{2a_1}\right)$$

where the coefficients are described by Equation (6):

$$a_2 = rc$$

$$a_1 = (\alpha R_{drv}c + rC_{rep} - \alpha cR_{rep} - rcm - rC_G)$$

$$a_0 = \left(\alpha R_{drv}C_{rep} + \alpha R_{rep}cm + \alpha R_{rep}C_G + \frac{rcm^2}{2} + rmC_G - T_{budget}\right) \quad (6)$$

Processor 110 determines the feasible repeater locations from the solutions at step 220. Feasible locations for repeaters 16 are between driver 12 and gate 14. That is, distance $x_{min}$ is not less than the distance of driver 12, and distance $x_{max}$ is not greater than the distance of gate 14. Additionally, for repeater locations to be feasible, the following condition needs to be satisfied ($\sqrt{a_1^2 - 4a_2a_0}2a_1) \geq 0$. If the condition is not satisfied, the delay constraint $T_{budget}$, or the location of driver 12 or gate 14 may be modified.

At step 222, processor 110 determines whether the desired number of dimensions, as counted by counter 150, have been processed. If the desired number of dimensions have not been processed, the method proceeds to step 224, where counter 150 is incremented. The method then proceeds to step 214 to determine the path delay equation for the next dimension. If the desired number of dimensions have been processed at step 222, the method proceeds to step 226 to determine repeater allocation region 60 for repeater 16. Repeater allocation region 60 is determined by graphing the maximum and minimum coordinates for each dimension as described in connection with FIG. 3. Repeater 16 may be placed in any part of repeater allocation region 60 that does not overlap with a non-reserved region of a design block 66. After determining the repeater allocation region, the method terminates.

FIG. 5 is a flowchart of a method for determining repeater allocation regions 60 for multiple repeaters 16 that may be used in system 100 of FIG. 3. The method begins at step 310, where processor 110 receives delay constraint $t_{budget}$ and net attributes describing net 10. The net attributes may include, for example, the length m of interconnect 11 from driver 12 to gate 14, gate load $C_L$, repeater driver resistance $R_{rep}$ and input gate capacitance $C_{rep}$, driver output resistance $R_{drv}$, and number of repeaters K. Counter 150 is initialized at step 312 in order to track the number of dimensions and the number of repeaters 16 that have been processed.

At steps 314 through 318, a path delay equation $T_{path}$ is determined. Pre-repeater module 122 determines pre-repeater path delay $T_{pre}$ at step 314. The pre-repeater path delay $T_{pre}$, which describes the path delay from driver 12 to the ith repeater, is expressed by Equation (7):

$$T_{pre} = T_{drv} + R_{drv}\left(\frac{x_ic}{i} + C_{rep}\right) + (i-1)T_{rep} + \quad (7)$$
$$R_{rep}\left(\frac{x_ic}{i} + C_{rep}\right)(i-1) + \frac{rx_i}{i} * \frac{cx_i}{2i} * i + \frac{rx_i}{i} * i * C_{rep}$$

where $T_{drv}$ represents the intrinsic gate delay of driver 12, and $T_{rep}$ represents intrinsic gate delay of repeater 16. Post-repeater module 124 determines post-repeater path delay $T_{post}$ at step 316. The post-repeater path delay $T_{post}$, which describes path delay from the ith repeater to gate 14, is expressed by Equation (8):

$$T_{post} = (k-i+1)T_{rep} + (k-i) * R_{rep}C_{rep} + \quad (8)$$
$$R_{rep}C_L + R_{rep}\left(\frac{(m-x_i)c}{(k-i+1)}\right) * (k-i+1) +$$
$$\frac{r(m-x_i)}{(k-i+1)} * \frac{c(m-x_1)}{2(k-i+1)}(k-i+1) +$$
$$\frac{r(m-x_1)}{(k-i+1)} * C_L + \frac{r(m-x_i)}{(k-i+1)} * C_{rep} * (k-i)$$

Path delay module 120 determines the path delay $T_{path}$ from the pre-repeater path delay $T_{pre}$ the post-repeater path delay $T_{post}$ at step 318 using Equation (9):

$$T_{path} = T_{pre} + T_{post} \quad (9)$$

Equation (9) may be also expressed by Equation (10):

$$T_{path} = x_i^2 a_2 + x_i a_1 + a_0 \quad (10)$$

where the coefficients of the $x_i$ terms are given by Equations (11):

$$a_2 = \frac{rc(k+1)}{2i(K-i+1)} \quad (11)$$

$$a_1 = \frac{(R_{drv} - R_{rep})c}{i} + \frac{r(C_{rep} - C_L) - rcm}{(K-i+1)}$$

$$a_0 = T_{drv} + KT_{rep} + \left(R_{drv} + (K-1)R_{rep} + \frac{rm(K-i)}{(K-i-1)}\right)C_{rep} +$$
$$R_{rep}(cm + C_L) + \frac{rcm^2}{2(K-i+1)} + \frac{rmC_L}{(K-i-1)}$$

Processor 110 applies delay constraint $t_{budget}$ to the path delay $T_{path}$ at step 320, as shown by Equation (12):

$$x_i^2 a_2 + x_i a_1 + (a_0 - T_{budget}) = 0 \quad (12)$$

Solver module 130 solves the path delay equation for distance variable $x_i$ at step 322, as shown by Equation (13):

$$x_{min}^i = MAX\left(0, \frac{-a_1 - \sqrt{a_1^2 - 4a_2(a_0 - T_{budget})}}{2a_1}\right) \quad (13)$$

$$x_{max}^i = MIN\left(m, \frac{-a_1 - \sqrt{a_1^2 - 4a_2(a_0 - T_{budget})}}{2a_1}\right)$$

Feasible locations for the repeater are determined at step 324 using a procedure similar to the one described in connection with FIG. 4.

The method then proceeds to step 326 to determine whether the desired number of dimensions, as counted by counter 150, have been processed. If the desired number of dimensions have not been processed, the method proceeds to step 328, where counter 150 is incremented. The method returns to step 314 to determine the pre-repeater path delay $T_{pre}$ for the next dimension. If the desired number of dimensions have been processed at step 326, the method proceeds to step 330 to determine repeater allocation region 60 for repeater 16. Repeater allocation region 60 may be determined in a manner as described in connection with FIG. 4.

At step 332, processor 110 determines whether there is a next repeater. If there is a next repeater at step 332, the method moves to the next repeater at step 334. The method then proceeds to step 336, where counter 150 is incremented to show that another repeater is being processed. The method then returns to step 314, where pre-repeater path delay equation $T_{pre}$ is determined for the next repeater. If there is no next repeater at step 332, the method terminates.

FIG. 6 is a flowchart of a method for determining a number of repeaters 16 to place between driver 12 and gate 14. The method determines a number of repeaters 16 that satisfies a given delay constraint $t_{budget}$. Additionally, the method determines an optimal number of repeaters 16 in the absence of a delay constraint.

The method begins at step 510, where path delay module 120 determines a path delay equation for inserting K repeaters, as expressed by Equation (14):

$$T_{path} = T_{drv} + R_{drv}\left(\frac{cm}{(K+1)} + C_{rep}\right) + T_{rep}(K-1) + \quad (14)$$
$$R_{rep}\left(\frac{cm}{(K+1)} + C_{rep}\right)*(K-1) + T_{rep} + \left(\frac{cm}{(K+1)} + C_L\right) +$$
$$\frac{rL}{(K+1)}\left(\frac{cm}{2(K+1)} + C_{rep}\right)*K + \frac{rL}{(K+1)}\left(\frac{cm}{2(K+1)} + C_L\right)$$
$$= T_{drv} + (K-1)T_{rep} + R_{drv}cm + R_{drv}C_{rep} + R_{rep}C_{rep}(K-1) +$$
$$R_{rep}C_L + \frac{rcm^2}{2(K+1)} + \frac{rC_{rep}mK}{(K+1)} + \frac{rmC_L}{(K+1)}$$

where length L represents regular intervals at which repeaters are to be inserted, given by $$L = \frac{m}{(K+1)},$$

and $C_L$ represents the capacitance of gate 14.

The method determines whether a delay constraint has been supplied at step 512. If a delay constraint is provided at step 512, the method proceeds to step 514, where the delay constraint is applied to Equation (14), as expressed by Equation (15):

$$T_{budget} = T_{drv} + (K-1)T_{rep} + R_{drv}cm + R_{drv}C_{rep} + \quad (15)$$
$$R_{rep}C_{rep}(K-1) + R_{rep}C_L + \frac{rcm^2}{2(K+1)} + \frac{rC_{rep}mK}{(K+1)} + \frac{rmC_L}{(K+1)}$$

Substituting a variable y=K+1 into Equation (15) yields Equation (16):

$$b_2y^2 b_1y + b_0 = 0 \quad (16)$$

where the coefficients are given by Equation (17):

$$b_2 = R_{rep}C_{rep} + T_{rep}$$
$$b_1 = T_{drv} - 2T_{rep} + R_{drv}cm + R_{drv}C_{rep} + R_{rep}C_L + rmC_{rep}2R_{rep}C_{rep} - T_{budget} \quad (17)$$
$$b_o = \frac{rcm^2}{2} - rmC_{rep} + rmC_L$$

Solver module 130 solves the path delay equation for the number of repeaters K at step 516, as expressed by Equation (18):

$$K_{min}^i = \left(\frac{-b_1 - \sqrt{b_1^2 - 4b_2b_0}}{2b_1}\right) - 1 \quad (18)$$

-continued
$$K_{max}^i = \left(\frac{-b_1 - \sqrt{b_1^2 - 4b_2b_0}}{2b_1}\right) - 1$$

The number of repeaters 16 is determined to be within $[K_{min}^i, K_{max}^i]$ at step 517. After determining the number of repeaters 16, the method terminates.

Referring back to step 512, if there is no delay constraint, the method proceeds to step 518. At step 518, the path delay equation $T_{path}$ as expressed by Equation (14) is minimized by setting $$\frac{\partial T_{path}}{\partial K} = 0.$$

The minimized path delay equation is solved for an opt number of repeaters K at step 320. The result may be expressed using Equation (19):

$$K = \left[\sqrt{\frac{(rcm^2/2 + rmC_{rep} + rmC_L)}{(T_{rep} + R_{rep}C_{rep})}} - 1\right] \quad (19)$$

The number of repeaters 16 is determined from K at step 517. After determining the number of repeaters 16, the method terminates.

Embodiments of the invention may provide numerous technical advantages. A technical advantage of one embodiment is that repeater allocation regions 60 are determined that allow circuit designers to optimally place repeaters 16 on a circuit. Repeater allocation regions 60 represent regions where a repeater 16 may be placed while satisfying a delay constraint, and may be determined in one, two, or three spatial dimensions. Circuit designers may use the repeater allocation regions 60 to determine an arrangement of repeaters 16 without wasting circuit area.

Another technical advantage of one embodiment is that an optimal number of repeaters 16 may be determined. Given a delay constraint, an optimal number of repeaters 16 that satisfies the delay constraint is calculated. Alternatively, an optimal number of repeaters 16 is calculated for a net 10, without given a delay constraint. Accordingly, embodiments provide for determination of an optimal number and placement of repeaters 16 on a circuit.

Another technical advantage of one embodiment is that the embodiment may be used to determine repeater allocation regions for system design, interconnect design, circuit design, board design, and backplane design, among other areas of computer design.

Although an embodiment of the invention and its advantages are described in detail, a person skilled in the art could make various alterations, additions, and omissions without departing from the spirit and scope of the present invention as defined by the appended claims.

What is claimed is:

1. A method for determining a repeater allocation region, the method comprising:

formulating a path delay equation describing a path delay from a driver to a gate, the path delay equation comprising a function of a variable;

applying a delay constraint to the path delay equation;

solving the path delay equation for the variable to obtain one or more values for the variable; and determining a repeater allocation region from the values, the repeater allocation region indicating a position of a repeater.

2. The method of claim 1, wherein:
the path delay equation is expressed as a function of a distance from the driver; and
determining the repeater allocation region further comprises solving the path delay equation for the distance, the solved distance indicating the repeater allocation region.

3. The method of claim 1, wherein the path delay equation comprises a sum of a pre-repeater equation describing a path delay from the driver to the repeater and a post-repeater equation describing a path delay from the repeater to the gate.

4. The method of claim 1, further comprising repeating the following for each dimension of a predetermined number of dimensions:
formulating the path delay equation as a function of a dimension;
applying the delay constraint to the path delay equation; and
determining the repeater allocation region for the dimension from the path delay equation.

5. The method of claim 1, further comprising repeating the following for each repeater of a set of repeaters:
formulating the path delay equation for a repeater of the set of repeaters;
applying the delay constraint to the path delay equation; and
determining the repeater allocation region for the repeater from the path delay equation.

6. The method of claim 5, further comprising:
expressing the path delay equation as a function of a variable representing the number of the repeaters of the set;
solving the path delay equation for the variable; and
determining a range for the number of the repeaters from the solved path delay equation.

7. The method of claim 5, further comprising:
expressing the path delay equation as a function of a variable representing the number of the repeaters of the set;
optimizing the path delay equation for the variable; and
determining a range for the number of the repeaters from the optimized path delay equation.

8. A system for determining a repeater allocation region, the system comprising:
a path delay module operable to formulate a path delay equation describing a path delay from a driver to a gate, the path delay equation comprising a function of a variable;
a processor operable to:
apply a delay constraint to the path delay equation;
solve a path delay equation for the variable to obtain one or more values for the variable; and
determine a repeater allocation region from the values, the repeater allocation region indicating a position of a repeater.

9. The system of claim 8, wherein:
the path delay equation is expressed as a function of a distance from the driver; and
the processor is operable to determine the repeater allocation region by solving the path delay equation for the distance, the solved distance indicating the repeater allocation region.

10. The system of claim 8, wherein the path delay equation comprises a sum of a pre-repeater equation describing a path delay from the driver to the repeater and a post-repeater equation describing a path delay from the repeater to the gate.

11. The system of claim 8, wherein:
the path delay module is operable to formulate the path delay equation for each dimension of a predetermined number of dimensions;
the processor is operable to repeat the following for each dimension:
apply the delay constraint to the path delay equation; and
determine the repeater allocation region for the dimension from the path delay equation.

12. The system of claim 8, wherein:
the path delay module is operable to formulate the path delay equation for each repeater of a set of repeaters;
the processor is operable to repeat the following for each repeater of the set of repeaters:
apply the delay constraint to the path delay equation; and
determine the repeater allocation region for the repeater from the path delay equation.

13. The system of claim 12, wherein the processor is operable to:
express the path delay equation as a function of a variable representing the number of the repeaters of the set;
solve the path delay equation for the variable; and
determine a range for the number of the repeaters from the solved path delay equation.

14. The system of claim 12, wherein the processor is operable to:
express the path delay equation as a function of a variable representing the number of the repeaters of the set;
optimize the path delay equation for the variable; and
determine a range for the number of the repeaters from the optimized path delay equation.

15. A logic for determining a repeater allocation region, the logic encoded on media and operable to:
formulate a path delay equation describing a path delay from a driver to a gate, the path delay equation comprising a function of a variable;
apply a delay constraint to the path delay equation;
solve the path delay equation for the variable to obtain one or more values for the variable; and
determine a repeater allocation region from the values, the repeater allocation region indicating a position of a repeater.

16. The logic of claim 15, wherein:
the path delay equation is expressed as a function of a distance from the driver; and
the logic is operable to solve the path delay equation for the distance, the solved distance indicating the repeater allocation region.

17. The logic of claim 15, wherein the path delay equation comprises a sum of a pre-repeater equation describing a path delay from the driver to the repeater and a post-repeater equation describing a path delay from the repeater to the gate.

18. The logic of claim 15, the logic operable to repeat the following for each dimension of a predetermined number of dimensions:
formulating the path delay equation as a function of a dimension;
applying the delay constraint to the path delay equation; and determining the repeater allocation region for the dimension from the path delay equation.

19. The logic of claim 15, the logic operable to repeat the following for each repeater of a set of repeaters:

formulating the path delay equation for a repeater of the set of repeaters;

applying the delay constraint to the path delay equation; and determining the repeater allocation region for the repeater from the path delay equation.

20. The logic of claim 19, the logic operable to:

express the path delay equation as a function of a variable representing the number of the repeaters of the set;

solve the path delay equation for the variable; and determine a range for the number of the repeaters from the solved path delay equation.

21. The logic of claim 19, the logic operable to:

express the path delay equation as a function of a variable representing the number of the repeaters of the set;

optimize the path delay equation for the variable; and determine a range for the number of the repeaters from the optimized path delay equation.

22. A system for determining a repeater allocation region, the system comprising:

a path delay module operable to formulate a path delay equation describing a path delay from a driver to a gate, the path delay equation formulated for each repeater of a set of repeaters;

a processor operable to:

express the path delay equation as a function of a variable representing the number of the repeaters of the set;

solve the path delay equation for the variable;

determine the number of the repeaters of the set of repeaters from the solved path delay equation; and repeat the following for each repeater of the set of repeaters:

apply a delay constraint to the path delay equation;

solving the path delay equation for a distance from the driver; and determine a repeater allocation region for the repeater from the solved distance.

* * * * *